(12) United States Patent
Luning et al.

(10) Patent No.: US 8,404,592 B2
(45) Date of Patent: Mar. 26, 2013

(54) METHODS FOR FABRICATING FINFET SEMICONDUCTOR DEVICES USING L-SHAPED SPACERS

(75) Inventors: Scott Luning, Poughkeepsie, NY (US); Frank S. Johnson, Wappinger Falls, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 819 days.

(21) Appl. No.: 12/509,918

(22) Filed: Jul. 27, 2009

(65) Prior Publication Data

US 2011/0021026 A1    Jan. 27, 2011

(51) Int. Cl.
*H01L 21/302* (2006.01)
(52) U.S. Cl. ......... 438/692; 438/694; 438/719; 438/736
(58) Field of Classification Search .................. 438/692, 438/719, 736, 694
See application file for complete search history.

(56) References Cited

U.S. PATENT DOCUMENTS

| | | | |
|---|---|---|---|
| 6,803,631 B2 | 10/2004 | Dakshina-Murthy et al. | |
| 7,101,763 B1 | 9/2006 | Anderson et al. | |
| 7,390,746 B2 * | 6/2008 | Bai et al. | 438/689 |
| 2010/0267238 A1 * | 10/2010 | Johnson et al. | 438/692 |

* cited by examiner

*Primary Examiner* — Binh X Tran
(74) *Attorney, Agent, or Firm* — Ingrassia Fisher & Lorenz, P.C.

(57) ABSTRACT

Methods for fabricating semiconductor structures, such as fin structures of FinFET transistors, are provided. In one embodiment, a method comprises providing a semiconductor substrate and forming a plurality of mandrels overlying the semiconductor substrate. Each of the mandrels has sidewalls. L-shaped spacers are formed about the sidewalls of the mandrels. Each L-shaped spacer comprises a rectangular portion disposed at a base of a mandrel and an orthogonal portion extending from the rectangular portion. Each L-shaped spacer also has a spacer width. The orthogonal portions are removed from each of the L-shaped spacers leaving at least a portion of the rectangular portions. The semiconductor substrate is etched to form fin structures, each fin structure having a width substantially equal to the spacer width.

14 Claims, 3 Drawing Sheets

METHODS FOR FABRICATING FINFET SEMICONDUCTOR DEVICES USING L-SHAPED SPACERS

FIELD OF THE INVENTION

The present invention generally relates to methods for fabricating semiconductor devices, and more particularly relates to methods for fabricating FinFET semiconductor devices using L-shaped spacers.

BACKGROUND OF THE INVENTION

In contrast to traditional planar metal-oxide-semiconductor field-effect transistors (MOSFETs), which are fabricated using conventional lithographic fabrication methods, nonplanar FETs incorporate various vertical transistor structures, and typically include two or more gate structures formed in parallel. One such semiconductor structure is the "FinFET," which takes its name from the multiple thin silicon "fins" that are used to form the respective gate channels, and which are typically on the order of tens of nanometers in width.

More particularly, referring to the exemplary prior art nonplanar FET structure shown in FIG. 1, a FinFET 100 generally includes two or more parallel silicon fin structures (or simply "fins") 104 and 106. These structures are typically formed on a silicon-on-insulator (SOI) substrate (not shown), with fins 104 and 106 extending between a common drain electrode and a common source electrode (not shown). A conductive gate structure 102 "wraps around" three sides of both fins 104 and 106, and is separated from the fins by a standard gate oxide layer 103. Fins 104 and 106 may be suitably doped to produce the desired FET polarity, as is known in the art, such that a gate channel is formed within the near surface of the fins adjacent to gate oxide 103. The width of the gate, indicated by double-headed arrow 108, determines the effective channel length of the device.

The fins historically are fabricated using a procedure that includes the formation of thin sidewall spacers adjacent the sidewalls of larger, sacrificial features called "mandrels." These spacers are formed by an anisotropic etch of a blanket-coated and conformal, generally dielectric, layer overlying the mandrel. Following formation of the spacers, the sacrificial mandrels are selectively removed leaving the sidewall spacers remaining. These spacers then are used as etch masks for pattern transferring into a silicon-comprising substrate to form fins.

The formation of fins using such spacers presents several shortcomings. Because sidewall spacers are formed by an anisotropic etch along the sidewalls of a substantially straight-walled mandrel, they typically have one substantially straight and vertical sidewall (the surface adjacent the mandrel) and one contoured sidewall (the surface away from the mandrel). The contoured sidewall is typically characterized by a rounded and sloping upper portion that often terminates with a facet and/or a point. The rounded/faceted profile of spacers can be undesirable because the final fin structure may assume a non-rectangular profile or a thinner profile as a result of the pattern transfer process. Because the gate of a FinFET device is also a raised structure that conformably wraps about the fin, such non-rectangular or thinner profile of the fin adversely affects the length and shape of the channel resulting in inconsistent performance in these devices. In addition, such spacers have a high aspect ratio that causes the spacers to have relatively low mechanical stability. Thus, the spacers are prone to breakage, tipping, and collapsing when subjected to mechanical stresses, such as from moving chemicals.

Accordingly, it is desirable to provide methods for fabricating FinFET transistor devices and other semiconductor devices using planarized spacers having a rectangular profile and a reduced aspect ratio that result in improved fin profiles and fewer defects. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for fabricating semiconductor structures, such as fin structures of FinFET transistors, are provided. In accordance with an exemplary embodiment of the present invention, a method for fabricating a semiconductor structure comprises providing a semiconductor substrate and forming a plurality of mandrels overlying the semiconductor substrate. Each of the plurality of mandrels has sidewalls. L-shaped spacers are formed about the sidewalls of the plurality of mandrels. Each L-shaped spacer comprises a rectangular portion disposed at a base of a mandrel of the plurality of mandrels and an orthogonal portion extending from the rectangular portion. Each L-shaped spacer also has a spacer width. The orthogonal portions are removed from each of the L-shaped spacers leaving at least a portion of the rectangular portions. The semiconductor substrate is etched to form fin structures, each fin structure having a width substantially equal to the spacer width.

In accordance with another exemplary embodiment, a method for forming fin structures of a FinFET transistor comprises providing a silicon-comprising material and forming a plurality of mandrels overlying the silicon-comprising material. Each of the plurality of mandrels comprises a first mandrel material and a second mandrel material overlying the first mandrel material and has sidewalls. A first spacer material is conformally deposited overlying the plurality of mandrels and is anisotropically etched to form L-shaped spacers disposed adjacent each of the plurality of mandrels. The L-shaped spacers have a first aspect ratio and a width. The L-shaped spacers are planarized such that they have a second aspect ratio, wherein the second aspect ratio is less than the first aspect ratio. The silicon-comprising material is etched to form the fin structures. Each fin structure has a width substantially equal to the width of the L-shaped spacers.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The various embodiments of the present invention, illustrated in FIGS. 2-11, provide methods for fabricating semiconductor structures, and in particular fin structures of Fin-FET transistors, using L-shaped spacers. The L-shaped spacers each have a rectangular portion disposed overlying a fin-forming material and an orthogonal portion extending from the rectangular portion. The orthogonal portion is removed by planarization leaving the rectangular portion to form the fin. The lower aspect ratio of the rectangular portions of the L-shaped spacers lessens the tendency for the spacers to collapse during processing, thus avoiding the creation of defects. The more rectangular spacer profile also results in a more symmetric and right angular fin profile leading to enhanced device performance.

Figure 1:
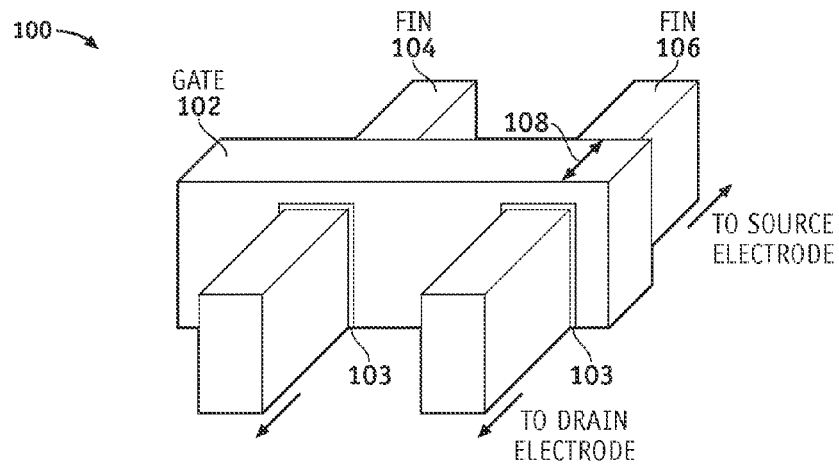
FIG. 1 is an isometric schematic view of a FinFET structure available in the prior art.
Figure 2:
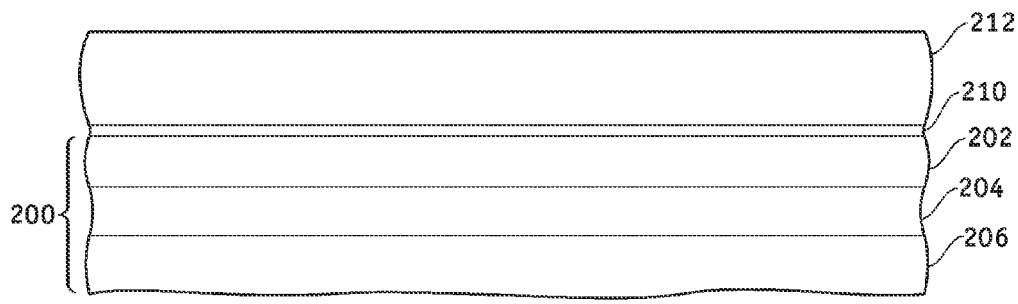
FIGS. 2-11 illustrate, in cross section, methods for fabricating fin structures of FinFET structures, in accordance with various embodiments of the present invention.

Referring to FIG. 2, in accordance with an exemplary embodiment of the present invention, a method for fabricating fin structures includes the step of providing a semiconductor substrate 200. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may comprise a silicon-comprising material 202 disposed on a silicon oxide material 204, commonly known as a silicon-on-insulator (SOI) structure that, in turn, is supported by a support substrate 206. The semiconductor substrate may further comprise silicon-comprising material 202 and any overlying layers, such as insulator layers, mask layers, and the like.

In another, optional, exemplary embodiment, a hard mask layer (not shown) may be disposed overlying the silicon-comprising material 202. The hard mask layer comprises any suitable mask material that exhibits a lower etch rate than the silicon-comprising material 202 when subjected to the same etch chemistry. In this regard, adequate control of the fin-forming etch process, discussed in more detail below, can be achieved. The hard mask layer can be, for example, a layer of silicon nitride having a thickness of about 50-200 nm. The silicon nitride can be deposited, for example, by LPCVD by the reaction of dichlorosilane and ammonia.

A mandrel-forming material 210 is deposited on the silicon-comprising material 202, or on the hard mask layer, if present. Examples of suitable materials for the mandrel-forming material 210 include, but are not limited to, photoresist, polycrystalline silicon, silicon oxide, silicon nitride, and the like. Mandrel-forming material 210 has a thickness in the range of about 15 nanometers (nm) to about 25 nm. In accordance with an exemplary embodiment, an additional mandrel-forming material 212 is deposited on the mandrel-forming material 210. In one embodiment, mandrel-forming material 212 has a thickness in the range of about 30 nm to about 60 nm. In another embodiment, mandrel-forming material 212 comprises the same material as mandrel-forming material 210. In yet another embodiment, mandrel-forming material 212 comprises a material having a polishing rate that is faster than a polishing rate of the mandrel-forming material 210 when subjected to the same chemical mechanical polishing (CMP) process parameters. As used herein, the terms "chemical mechanical polishing" and "chemical mechanical planarization" are used interchangeably. In a preferred embodiment, the mandrel-forming material 210 preferably comprises silicon nitride and the mandrel-forming material layer 212 comprises polycrystalline silicon.

Figure 3:
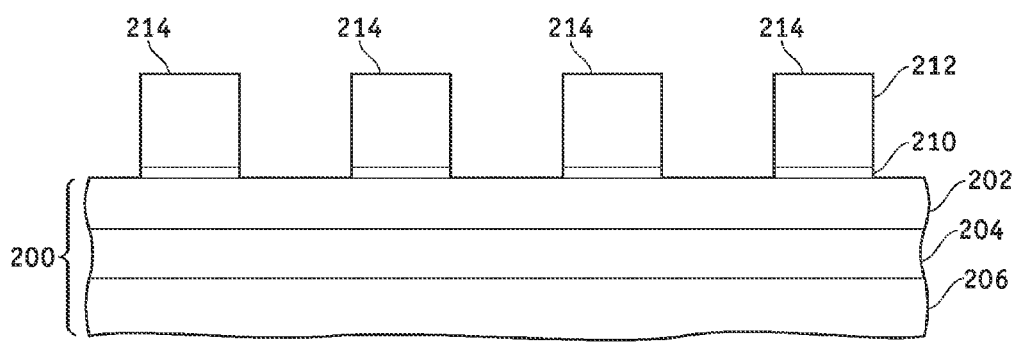

Referring to FIG. 3, after deposition of the mandrel-forming material 212, one or more patterned masks (not shown), such as one or more patterned photoresists, is formed on the mandrel-forming material 212, which then is etched along with the mandrel-forming material 210 to form a plurality of mandrels 214. In one embodiment, if the mandrel-forming material layer 210 comprises silicon nitride and the mandrel-forming material layer 212 comprises polycrystalline silicon, the mandrel-forming material layers 212 and 210 can be etched by $CF_4$, $CHF_3$, $CH_2F_2$ chemistries and $Cl_2$ or HBr chemistries, respectively.

Figure 4:
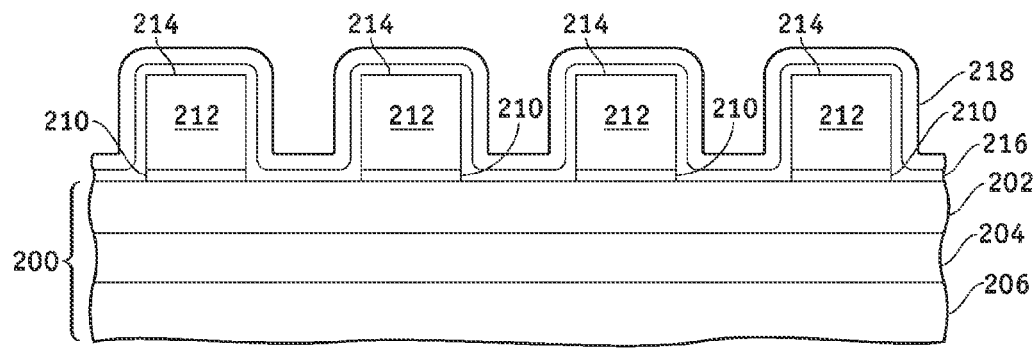

Next, as illustrate in FIG. 4, a spacer-forming material 216 is conformally deposited overlying the mandrels 214. The spacer-forming material 216 comprises a material having an etch rate that is slower than an etch rate of the mandrel-forming material layer 210 when subjected to the same etch chemistry. In one embodiment, the spacer-forming material is deposited to a thickness in the range of about 15 nm to about 25 nm. After deposition of spacer-forming material 216, a spacer-forming material 218 is conformally deposited overlying spacer-forming material 216. In one exemplary embodiment, the spacer-forming material 218 is deposited to a thickness in the range of about 30 nm to about 40 nm. Spacer-forming material 218 has a composition different from that of spacer-forming material 216. In a preferred embodiment, if mandrel-forming material 210 comprises a silicon nitride and mandrel-forming material 212 comprises polycrystalline silicon, spacer-forming material 216 comprises a silicon oxide and spacer-forming material 218 comprises silicon nitride.

Figure 5:
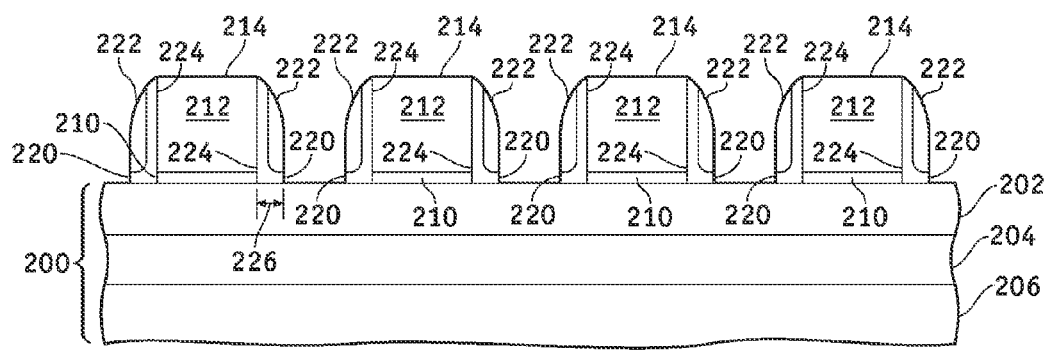

Referring to FIG. 5, the method continues with the anisotropic etch of spacer-forming material 218 and spacer-forming material 216 to form L-shaped spacers 220 disposed adjacent to sidewalls 224 of mandrels 214 and sacrificial spacers 222 overlying L-shaped spacers 220. The anisotropic etch may be performed by reactive ion etching using a chemistry, such as, for example, a $CH_4$, $CHF_3$, or $CH_2F_2$ chemistry, that etches the spacer-forming material 218 and spacer-forming material 216 at about the same rate but that is selective to the silicon-comprising material 202 (or the hard mask layer, if present). As illustrated, etching the two spacer forming layers in this manner results in the formation of the L-shaped spacers 220 underlying sacrificial spacers 222. In one exemplary embodiment, the mandrel heights and the parameters of the anisotropic etch are such that the L-shaped spacers 220 have a width, indicated by double-headed arrow 226, at the base of mandrels 214 that is in the range of about 15 nm to about 25 nm.

Figure 6:
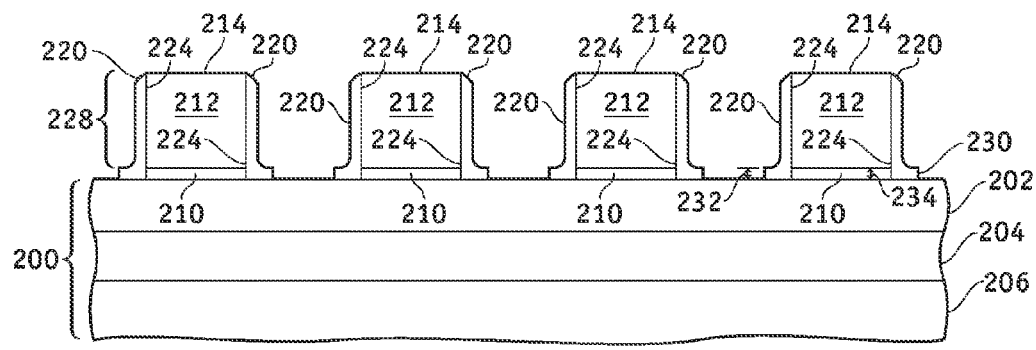

Next, the sacrificial spacers 222 are removed from the L-shaped spacers, as illustrated in FIG. 6. In one embodiment, the silicon nitride sacrificial spacers are removed using hot phosphoric acid. As shown in FIG. 6, the remaining L-shaped spacers each have a rectangular portion 230 that is disposed at the base of the mandrels 214. In one embodiment, the L-shaped spacers 220 have a thickness, indicated by double-headed arrow 232, that is no less than a thickness, indicated by double-headed arrow 234, of mandrel-forming material layer 210. The L-shaped spacers 220 also have an orthogonal portion 228 that extends from first rectangular portion 230 and along the sidewalls 224 of mandrels 214.

Figure 10:
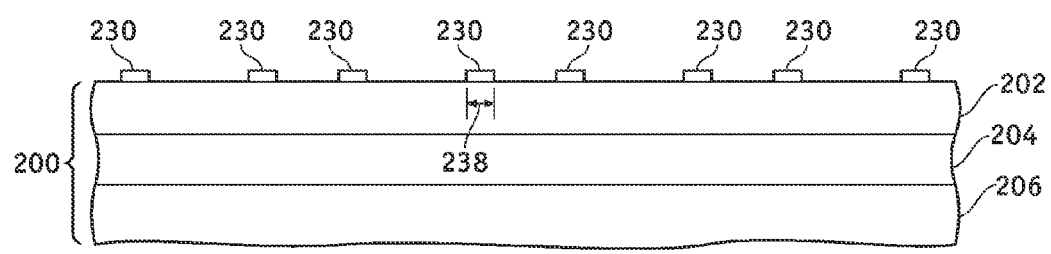

Following removal of sacrificial spacers 222, the orthogonal portions 228 of L-shaped spacers 220 are removed leaving at least a portion of the rectangular portions 230 overlying the silicon-comprising material 202 (or the hard mask layer, if present). In a preferred embodiment, illustrated in FIG. 7, the orthogonal portions 228 are removed using a CMP process that removes the orthogonal portions 228 along with mandrel-forming material 212. In this regard, mandrel-forming material 210 serves as a CMP stop layer to prevent removal of a significant amount of the rectangular portions 230 of the L-shaped spacers 220. During the CMP process, mandrels 214 provide mechanical support to the orthogonal portions, thus preventing, or at least minimizing, the incidences of the rectangular portions de-laminating, peeling, or otherwise separating from the silicon-comprising material 202. After removal of orthogonal portions 228 and mandrel-forming material 212, mandrel-forming material 210 is removed, as illustrated in FIG. 10. In this regard, rectangular portions 230, now having an aspect ratio less than the aspect ratio of the L-shaped spacers, remain overlying silicon-comprising material 202.

Figure 7:
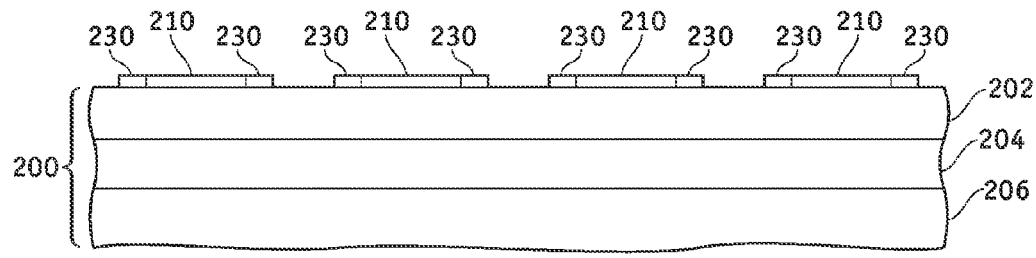
Figure 8:
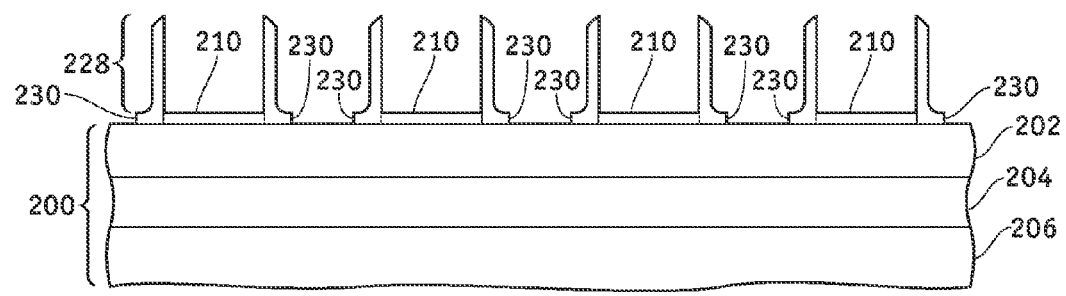

In another embodiment, illustrated in FIG. 8, mandrel-forming material 212 is first removed from mandrel-forming material 210 with the removal of the orthogonal portions 228 following thereafter. A polycrystalline silicon mandrel-forming material 212 can be removed from a silicon nitride mandrel-forming material 210 using an ammonium hydroxide etch chemistry. The orthogonal portions 228 then are removed by CMP such that the structure illustrated in FIG. 7 is achieved. After removal of second orthogonal portions 228, mandrel-forming material 210 is removed, as illustrated in FIG. 10. In this regard, rectangular portions 230, now having a lower aspect ratio, remain overlying silicon-comprising material 202.

Figure 9:
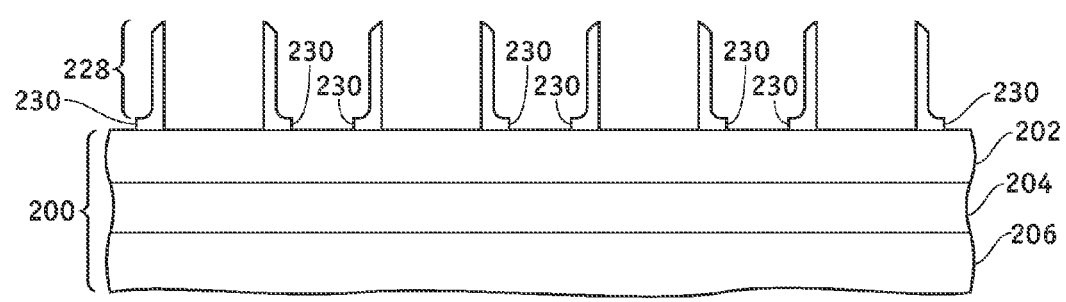

Referring to FIG. 9, in yet another embodiment, mandrel-forming material 212 and mandrel-forming material 210 are both removed before removal of orthogonal portions 228. In one exemplary embodiment, a polycrystalline silicon mandrel-forming material 212 can be removed from a silicon nitride mandrel-forming material 210 using an ammonium hydroxide etch chemistry and a silicon nitride mandrel-forming material 210 can be removed using a hot phosphoric acid chemistry. In another exemplary embodiment, mandrel-forming material 212 and mandrel-forming material 210 comprise the same material and can be removed using he same etch chemistry. The orthogonal portions 228 then are removed by CMP such that the structure illustrated in FIG. 10 is achieved. Because mandrel-forming material 210 is removed prior to removal of the orthogonal portions 228, the CMP process is performed for a predetermined time period. In this regard, an amount of rectangular portions 230 sufficient to serve as etch masks remains overlying silicon-comprising material 202. Accordingly, because of the lower aspect ratio of the rectangular portions 230 compared to the aspect ratio of the un-planarized L-shaped spacers 220, whether the lower aspect ratio is achieved as described with reference to FIG. 7, FIG. 8, or FIG. 9, the rectangular portions 230 are less likely to collapse, tip, or move during subsequent processing. Regardless of the methods used to obtain the structure of FIG. 10, the rectangular portions 230 have a width, indicated by double-headed arrow 238, that will substantially define the width of the fins to be subsequently formed. In one exemplary embodiment, the width of the rectangular portions is in the range of about 15 nm to about 25 nm.

Figure 11:
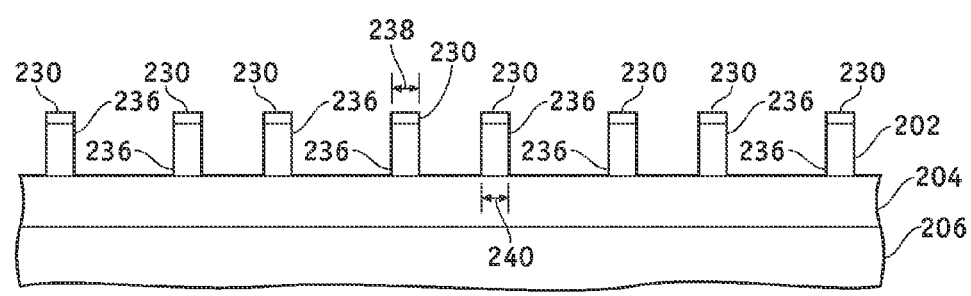

Next, after removal of mandrel-forming material 210 and planarization of orthogonal portions 228, regardless of the order performed, silicon-comprising material 202 is etched using the rectangular portions 230 as an etch mask to form silicon-comprising fins 236, as illustrated in FIG. 11. The more rectangular spacer profile of rectangular portions 230 results in a more symmetric and right angular fin profile, which in turn leads to enhanced device performance. The fins 236 are formed having a width, indicated by double-headed arrow 240, that is substantially equal to the width 238 of rectangular portions 230. In one exemplary embodiment, the width 240 of the fins 236 is in the range of about 15 nm to about 25 nm. It will be understood that, if a hard mask layer is disposed between the rectangular portions 230 and silicon-comprising material 202, the rectangular portions are used as etch masks during etching of the hard mask layer, preferably the rectangular portions are removed to decrease the aspect ratio of the etched hard mask layer, and the etched hard mask layer then is used as an etch mask during etching of silicon-comprising material 202 to form fins 236. After formation of fins 236, if the fins are to form part of a FinFET device, the method may continue with the formation of a gate insulator (not shown) about the sidewalls of the fins 236 and/or a conductive gate structure (not shown) overlying the fins 236. In a preferred exemplary embodiment, the conductive gate structure also is formed overlying the rectangular portions 230, although it will be appreciated that the rectangular portions 230 can be removed prior to the formation of the gate structure.

Accordingly, the various embodiments of the present invention provide methods for fabricating semiconductor structures, and in particular fin structures of FinFET transistors, using planarized spacers for the formation of the structures. The planarizing process reduces the aspect ratio and improves the profile of spacers used as etch masks by utilizing L-shaped spacers. The L-shaped spacers have a rectangular portion disposed overlying a fin-forming material and an orthogonal portion extending therefrom. The orthogonal portions are removed leaving the rectangular portions to form the fins. The lower aspect ratio of the rectangular portions lessens the tendency for spacers to collapse during processing, thus avoiding the creation of defects. The more rectangular spacer profile also results in a more symmetric and right angular fin profile leading to enhanced device performance.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a semiconductor structure, the method comprising the steps of:
    providing a semiconductor substrate;
    forming a plurality of mandrels overlying the semiconductor substrate, wherein each of the plurality of mandrels has sidewalls;
    depositing a first spacer material overlying the plurality of mandrels;
    depositing a second spacer material overlying the first spacer material;

anisotropically etching the first spacer material and the second spacer material forming L-shaped spacers about the sidewalls of the plurality of mandrels and sacrificial spacers overlying the L-shaped spacers, each L-shaped spacer comprising a rectangular portion disposed at a base of a mandrel of the plurality of mandrels and an orthogonal portion extending from the rectangular portion, and having a spacer width;

removing the sacrificial spacers;

after removing the sacrificial spacers, removing the orthogonal portions from each of the L-shaped spacers leaving at least a portion of the rectangular portions; and etching the semiconductor substrate to form fin structures, each fin structure having a width substantially equal to the spacer width.

2. The method of claim 1, wherein the step of forming a plurality of mandrels comprises:

depositing a first mandrel material overlying the semiconductor substrate;

depositing a second mandrel material overlying the first mandrel material;

forming a patterned mask overlying the second mandrel material; and etching the second mandrel material and the first mandrel material using the patterned mask as an etch mask.

3. The method of claim 1, wherein the step of forming a plurality of mandrels comprises forming a plurality of mandrels comprising silicon nitride and polycrystalline silicon overlying the silicon nitride, wherein the step of depositing a first spacer material comprises depositing silicon oxide, and wherein the step of depositing a second spacer material comprises depositing silicon nitride.

4. The method of claim 1, wherein each of the plurality of mandrels comprises a first mandrel material and a second mandrel material overlying the first mandrel material and wherein the step of removing comprises removing the second mandrel material and the orthogonal portions substantially simultaneously using chemical mechanical polishing.

5. The method of claim 4, wherein the first mandrel material has a polishing rate that is slower than the polishing rate of the second mandrel material when subjected to the same chemical mechanical process parameters.

6. The method of claim 1, wherein each of the plurality of mandrels comprises a first mandrel material and a second mandrel material overlying the first mandrel material and further comprising the step of removing the second mandrel material before the step of removing the orthogonal portions, wherein the step of removing the orthogonal portions comprises removing the orthogonal portions by CMP.

7. The method of claim 6, further comprising the step of removing the first mandrel material after the step of removing the second mandrel material and before the step of removing the orthogonal portions.

8. The method of claim 1, further comprising the step of:

forming a hard mask overlying the semiconductor substrate before the step of forming a plurality of mandrels; and etching the hard mask using the rectangular portions as an etch mask, the step of etching the hard mask performed after the step of removing the orthogonal portions; and wherein the step of etching the semiconductor substrate comprises etching the semiconductor substrate using the etched hard mask as an etch mask.

9. The method of claim 8, further comprising the step of removing the rectangular portions from the hard mask after the step of etching the hard mask and before the step of etching the semiconductor substrate.

10. A method for forming fin structures of a FinFET transistor, the method comprising the steps of:

providing a silicon-comprising material;

forming a plurality of mandrels overlying the silicon-comprising material, each of the plurality of mandrels comprising a first mandrel material and a second mandrel material overlying the first mandrel material, wherein each of the plurality of mandrels has sidewalls;

conformally depositing a first spacer material overlying the plurality of mandrels;

depositing a second spacer material overlying the first spacer material;

anisotropically etching the first spacer material and the second spacer material to form the L-shaped spacers disposed adjacent each of the plurality of mandrels and sacrificial spacers overlying the L-shaped spacers, the L-shaped spacers having a first aspect ratio and a width;

removing the sacrificial spacers;

planarizing the L-shaped spacers such that they have a second aspect ratio, wherein the second aspect ratio is less than the first aspect ratio;

etching the silicon-comprising material to form the fin structures, each fin structure having a width substantially equal to the width of the L-shaped spacers.

11. The method of claim 10, wherein the step of planarizing comprises planarizing the second mandrel material and the L-shaped spacers substantially simultaneously using chemical mechanical polishing.

12. The method of claim 11, wherein the first mandrel material has a polishing rate that is slower than the polishing rate of the second mandrel material when subjected to the same chemical mechanical process parameters.

13. The method of claim 10, further comprising the step of removing the second mandrel material before the step of planarizing the L-shaped spacers.

14. The method of claim 13, further comprising the step of removing the first mandrel material after the step of removing the second mandrel material and before the step of planarizing the L-shaped spacers.

* * * * *